(12) United States Patent
Bachmaier et al.

(10) Patent No.: US 7,554,196 B2
(45) Date of Patent: Jun. 30, 2009

(54) PLASTIC PACKAGE AND SEMICONDUCTOR COMPONENT COMPRISING SUCH A PLASTIC PACKAGE, AND METHOD FOR ITS PRODUCTION

(75) Inventors: Ulrich Bachmaier, Ruderting (DE); Michael Bauer, Nittendorf (DE); Robert-Christian Hagen, Sarching (DE)

(73) Assignee: Infineon Technologies AG, Munich (DE)

( * ) Notice: Subject to any disclaimer, the term of this patent is extended or adjusted under 35 U.S.C. 154(b) by 63 days.

(21) Appl. No.: 11/247,068

(22) Filed: Oct. 11, 2005

(65) Prior Publication Data

US 2006/0091522 A1   May 4, 2006

(30) Foreign Application Priority Data

Oct. 11, 2004   (DE) .................. 10 2004 049 663

(51) Int. Cl.
*H01L 23/06* (2006.01)
*H01L 23/522* (2006.01)

(52) U.S. Cl. ............... 257/729; 257/723; 257/E23.165; 257/E23.166

(58) Field of Classification Search ......... 257/685–686, 257/723–726, 729, E23.001, E23.135–E23.136, 257/E23.154, E23.165–E23.166
See application file for complete search history.

(56) References Cited

U.S. PATENT DOCUMENTS

| 5,394,303 | A | * | 2/1995 | Yamaji | 361/749 |
|---|---|---|---|---|---|
| 5,490,324 | A | * | 2/1996 | Newman | 29/830 |
| 5,837,609 | A | * | 11/1998 | Todd et al. | 438/678 |
| 5,907,190 | A | * | 5/1999 | Ishikawa et al. | 257/795 |
| 6,093,584 | A | | 7/2000 | Fjelstad | |
| 6,162,514 | A | * | 12/2000 | Moriya | 428/1.1 |
| 6,465,742 | B1 | | 10/2002 | Hiraoka et al. | |
| 6,528,869 | B1 | * | 3/2003 | Glenn et al. | 257/678 |
| 6,646,289 | B1 | * | 11/2003 | Badehi | 257/81 |
| 6,900,529 | B2 | * | 5/2005 | Kledzik et al. | 257/686 |
| 6,950,629 | B2 | * | 9/2005 | Nagy | 455/63.4 |
| 6,972,480 | B2 | * | 12/2005 | Zilber et al. | 257/678 |
| 7,384,698 | B2 | * | 6/2008 | Riedl et al. | 428/687 |
| 2002/0053735 | A1 | * | 5/2002 | Neuhaus et al. | 257/728 |
| 2002/0142174 | A1 | * | 10/2002 | Kropp et al. | 428/447 |
| 2003/0030143 | A1 | | 2/2003 | Wennemuth et al. | |
| 2003/0100654 | A1 | * | 5/2003 | Chheang et al. | 524/445 |
| 2003/0183418 | A1 | * | 10/2003 | Castro et al. | 174/260 |
| 2003/0207114 | A1 | * | 11/2003 | Atzesdorfer et al. | 428/403 |
| 2003/0224613 | A1 | * | 12/2003 | Ramanathan et al. | 438/745 |
| 2004/0084760 | A1 | * | 5/2004 | Liu et al. | 257/686 |

(Continued)

FOREIGN PATENT DOCUMENTS

DE   1038278   4/2003

(Continued)

*Primary Examiner*—Douglas M Menz
*Assistant Examiner*—Matthew W Such
(74) *Attorney, Agent, or Firm*—Dicke, Billig, Czaja, PLLC (57) ABSTRACT

A plastic package and to a semiconductor component including such a plastic package, as well as to a method for its production is disclosed. In one embodiment, the plastic package includes plastic outer faces, which include lower outer contact faces on a lower side of the plastic package and upper outer contact faces on an upper side, which are connected together via outer conductor tracks. The conductor tracks include conduction paths which are formed on exposed conducting deposits in the plastic package.

14 Claims, 7 Drawing Sheets

U.S. PATENT DOCUMENTS

2004/0132300 A1* 7/2004 Konigshofen ............... 438/689
2004/0145044 A1* 7/2004 Sugaya et al. ............... 257/698
2005/0147801 A1* 7/2005 Taggert et al. .............. 428/209
2005/0280139 A1* 12/2005 Zhao et al. .................. 257/704
2006/0273443 A1* 12/2006 Bauer et al. ................. 257/687

FOREIGN PATENT DOCUMENTS

| DE | 102004009056 | 9/2005 |
| EP | 1085352 | 3/2001 |
| WO | 2005/081316 | 2/2005 |

* cited by examiner

PLASTIC PACKAGE AND SEMICONDUCTOR COMPONENT COMPRISING SUCH A PLASTIC PACKAGE, AND METHOD FOR ITS PRODUCTION

CROSS-REFERENCE TO RELATED APPLICATIONS

This Utility Patent Application claims priority to German Patent Application No. DE 10 2004 049 663.3, filed on Oct. 11, 2004, which is incorporated herein by reference.

FIELD OF THE INVENTION

The invention relates to a plastic package and to a semiconductor component comprising such a plastic package, as well as to a method for its production. In particular, the invention relates to a semiconductor component arrangement for stacking semiconductor components having at least one semiconductor base component. The semiconductor base component includes a package which has plastic outer faces. Lower outer contact faces for applying outer contacts are arranged on a lower side of the package, and upper outer contact faces for stacking a semiconductor component on the plastic package of the semiconductor base component are arranged on an upper side of the package, opposite the lower side.

BACKGROUND

Conventional semiconductor base components, such as those disclosed by document DE 101 38 278, are intended for stacking BGA or LBGA packages (ball grid array or large ball grid array) with additional flexible rewiring films, which are larger in area than the semiconductor components to be stacked and extend beyond the edge of the semiconductor components, so that they can be bent in the direction of a semiconductor component arranged below in a semiconductor component stack and can be electrically connected to the semiconductor component arranged underneath via the flexible film.

A semiconductor module with such stacked semiconductor component has the disadvantage that the semiconductor components cannot be stacked with a minimal space requirement, and in particular the bent rewiring film requires a bending radius below which the value cannot fall without risking microcracks in the rewiring lines arranged on the rewiring film.

Other conventional semiconductor base components comprise a rewiring substrate with outer contacts arranged on the lower side of the rewiring substrate, and at least one semiconductor chip on the upper side of the rewiring substrate, for example a memory component such as a DRAM (dynamic random access memory), is arranged at the center of the rewiring substrate.

If such a conventional semiconductor component is to be used as the semiconductor base component for a semiconductor module, then only the edge regions of the rewiring substrate can be available for applying outer contacts of a stacked semiconductor component, as described in Patent Application DE 10 2004 009 056. Since the center of the rewiring substrate is occupied by the semiconductor chip, the number and arrangement of outer contacts of the semiconductor component to be stacked is very restricted, so that a large number of known package types, such as BGA or LBGA packages, cannot be stacked on such a conventional semiconductor component with a rewiring substrate. For these and other reasons, there is a need for the present invention.

SUMMARY

In one embodiment, the present invention provides a plastic package of a semiconductor component with plastic outer faces, which includes lower outer contact faces arranged on a lower side and upper outer contact faces arranged on an upper side, wherein the lower and upper outer contact faces are electrically connected together via conductor tracks, and wherein the conductor tracks comprise a metal layer which is arranged on conduction paths, the conduction paths comprising exposed conducting deposits in the plastic of the package.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor component with a wiring substrate and a method for its production, which can be used as a semiconductor base component. The invention provides a semiconductor component in which an arbitrary arrangement of outer contact faces can be provided on the upper side, and outer contact faces can be distributed independently thereof on the lower side of the wiring substrate for a surface-mountable component. The invention minimizes the space requirement and the area requirement of the semiconductor component, and in particular to reduce the space requirement of a memory module comprising DRAM semiconductor components.

In one embodiment, the present invention relates to plastic package of a semiconductor component having plastic outer faces. Lower outer contact faces are arranged on a lower side of the plastic package, and the plastic package has upper contact faces on an upper side which is opposite the lower side. Via conductor tracks and through-contacts, the outer contact faces are in electrical connection with the lower contact faces. To this end, the conductor tracks comprise a structured metal layer, which is arranged on conduction paths. The conduction paths in turn comprise exposed conducting deposits in the plastic package.

This semiconductor component has the advantage that no additional intermediate wiring substrates or rewiring films are required for connecting the outer contact faces on the upper side. Rather, the package outer contour and the plastic compound of the package are used to generate conduction paths, on the one hand on the plastic outer faces of the package outer contour, and on the other hand through the plastic package compound, which are amplified to form conductor tracks with the aid of structured metal coatings. Since the plastic package compound and/or the plastic outer faces are used directly to generate conduction paths, the space requirement for providing outer contact faces on the upper side of the semiconductor component and for applying conductor tracks along the outer contour of the plastic package and through the plastic package, with electrical connection to the outer contacts on the lower side of the package, is compactly configured. Furthermore, the plastic package per se already forms the support material for these conductor tracks and therefore fulfills a double function, as the plastic package on the one hand embeds the components of the semiconductor chip and, on the other hand, offers the possibility on its plastic outer faces to electrically connect upper outer contact faces to lower outer contact faces.

To this end, it is not necessary for the conduction paths to already include a continuous metallization. Rather, a conduction path is formed from mutually isolated electrically conducting particles of the plastic outer faces of the package, which are provided along a conductor track structure on the plastic outer faces and/or the access openings of the plastic package. The electrically conducting particles are arranged next to one another in the region of the conduction paths so that, when there is a structured metal coating on these conduction paths, conductor tracks are formed from the mutually isolated electrically conducting particles owing to the structured coating. To this end, these conductor tracks extend on the plastic outer faces or through the access openings through the plastic package.

In one embodiment of the invention, the exposed conducting deposits on the conduction paths are covered with a lower metal layer a few nanometers thick. This lower first metal layer ensures that the exposed conducting deposits arranged isolatedly on the conduction paths are electrically connected to one another. In another embodiment of the invention, the exposed conducting deposits on the conduction paths are covered with an upper metal layer a few micrometers thick. While the lower metal layer is applied by vapor deposition, sputtering or chemical deposition on the exposed conducting deposits, the second upper metal layer a few micrometers thick is applied by electrolytic or printing techniques.

In another embodiment of the invention, the exposed conducting deposits in the plastic comprise metal complexes. These metal complexes are constituents of metalorganic compounds, which are freed from their organic constituents by heat irradiation, laser exposure and/or heat treatment of their organic constituent and are then connected as metal complexes of the conduction paths for connection by depositing metals on these metal complexes to form conductor tracks.

In another embodiment of the invention, the exposed conducting deposits in the plastic comprise conducting nanoparticles. In one embodiment, such conducting nanoparticles are fullerenes. While fullerenes a hollow spherical structure of hexagonally arranged carbon atoms, nanotubes form hollow tubes which hexagonally arranged carbon atoms on their circumference. In the present invention, these fullerenes or nanotubes are partially exposed to form conduction paths by evaporating the surrounding plastic compound with the aid of laser processing.

Another embodiment of the invention relates to a semiconductor component having a plastic package which comprises metallic conductor tracks on its outer contact faces and/or through the plastic compound as described above. Such a semiconductor component may preferably comprise on its lower side a wiring substrate, which comprises through-contacts in its edge region. These through-contacts through the wiring substrate are electrically connected on its upper side to the outer conductor tracks of the plastic package, and are connected to the lower outer contact faces on the lower side of the wiring substrate via a wiring structure. In order to be able to form conduction paths on the outer contact faces of the plastic package, the plastic comprises deposits of a metalorganic compound whose metallic constituents are exposed in the conduction paths and covered by one or more metal layers.

In another embodiment of the invention, the size and arrangement of the upper outer contact faces on the upper side of the semiconductor component corresponds to the size and arrangement of surface-mountable outer contacts of a semiconductor component to be stacked. Since the size and arrangement of the upper outer contact faces on the upper side of the semiconductor component is arbitrary, and can be selected independently of the outer contact faces arranged on the lower side and/or the outer contacts arranged on the lower side of the semiconductor component, the outer contact faces and their size and arrangement can be adapted to any semiconductor component to be stacked, without additional rewiring films or rewiring plates having to be arranged between the semiconductor component and a semiconductor component to be stacked. It is therefore possible to minimize the space requirement for a stack of semiconductor components.

Another embodiment of the invention relates to a semiconductor module comprising a semiconductor base component and at least one semiconductor component stacked thereon, the semiconductor base component comprising a structure of conduction paths as already described in detail above. The stacked semiconductor component of this semiconductor module comprises surface-mountable outer contacts, which correspond with the upper outer contact faces of the semiconductor base component. In one embodiment of the invention, the semiconductor module includes memory components, preferably DRAMS and/or GDRAMS.

The semiconductor module may furthermore include at least one logic component, preferably an MPCP (microprocessor chip package) and/or a memory component, preferably a DRAM (dynamic random access memory) and/or a GDRAM (graphic dynamic random access memory). Such a semiconductor module has the advantage that it is possible to manage the memory module in a compact structure with the aid of the processor module.

A method for producing a plastic package with plastic outer faces, which includes lower outer contact faces arranged on a lower side and upper outer contact faces arranged on an upper side, wherein the lower and upper outer contact faces are electrically connected together via conductor tracks, includes the following process.

A polymer of a plastic package compound is mixed with a deposit material, which releases electrically conducting material when irradiated. The plastic package is then formed with the plastic package compound, the components such as the semiconductor chip, electrical connections and substrate being partially or fully embedded in the plastic package compound with electrically conducting deposit material. Next, conduction paths are produced by selectively exposing electrically conducting material to form isolatedly arranged conductive positions between outer contact-face regions on the upper side of the plastic package and contact terminal faces on a wiring substrate.

Laser scribing or photolithographic covering and protection of the regions of the plastic material which are not to be exposed are used during the selective exposure. The electrically conducting positions of the plastic deposits are exposed by partially dissolving the plastic material in the photolithographically exposed conduction path structure regions. In a subsequent, the electrically exposed conducting materials are amplified with a lower metal layer and this now continuous electrically conducting metal layer is amplified by electrolytically depositing an upper metal layer a few micrometers thick on the lower metal layer to form a wiring structure between lower and upper outer contact faces.

This method has the advantage that merely the plastic package compound has a modified composition, in which either metal ions of a metalorganic compound present isolatedly in the plastic package compound or electrically conducting material particles are embedded in the plastic package compound. These are preferably exposed partially only in the regions of the intended conduction paths on the upper side of the semiconductor component or in corresponding access holes through the plastic package compound. In order to produce this plastic, either metalorganic compounds are admixed or electrically conducting nanoparticles, preferably fullerenes, are added as deposits.

For selective exposure of electrically conducting material in the region of the conduction paths, the plastic outer faces of the plastic package may be irradiated with photons, ions and/or electrons. Partial dissolving of these regions is also possible, if the other regions of the plastic outer faces have previously been protected by a structured protective layer or a photolithographic.

In one exemplary embodiment of the method, selective exposure of electrically conducting material to form conduction paths through the plastic package is carried out by laser ablation of the plastic package compound to form corresponding through-contacts at intended positions. The resulting access opening is then electrolytically filled with the electrically conducting material of the upper metal coating. In order to promote and perform this filling, a thin metal layer a few nanometers thick may previously be arranged on the walls of the access hole, and then amplified by electrolytic deposition.

It is furthermore possible to produce the lower metal layer a few nanometers thick by currentless deposition of a correspondingly thin structured metal layer on the exposed electrically conducting material. In this embodiment, the structuring in conductor tracks or through-contacts is dictated by the selectively exposed electrically conducting material in conductive positions mutually arranged isolatedly.

The amplification of the electrically conducting material to form a lower metal layer a few nanometers thick may be carried out by means of sputtering technology, vapor deposition technology and/or plasma deposition on the plastic outer faces of the package or on the inner walls of access openings through the plastic package. The lower metal layer is then exposed in the conduction paths by photolithography, and these conduction paths may subsequently be amplified by a second electrolytic metal layer. After the metal layers have been grown, the photolithographic layer and then the nanometer-thin applied metal layer may be removed where no conductor tracks are to be arranged.

In summary, it may be stated that a metalorganic or inorganic complex with metal ions or a corresponding compound is added to a plastic material in the form of a plastic package compound, such as a pressing compound, a globe-top compound or a thermoplastic compound. This complex or compound is unstable so that it can be separated into a metallic part and an organic or inorganic path by energetic radiation such as, for example, laser radiation, UV radiation, X-radiation or ion bombardment.

On the other hand, it is also possible to admix such metalorganic or inorganic compounds having a metal complex into a coating composition. This coating composition may then be applied selectively on a normally fabricated component having a plastic package, in order subsequently to expose metal particles on the plastic outer sides of the semiconductor component at the regions coated with coating composition. On the other hand, the coating composition may be applied surface-wide and structured by means of corresponding photolithography process.

The penetration depth into the plastic package compound and/or into the coating composition in order to expose the metallic constituents contained therein is so small that low-intensity radiation needs to be applied in order to expose metal particles only on the surface of the encapsulation material, or the coating composition. A conduction path structure comprising metallic particles is thereby generated, which are in turn used as condensation seeds for subsequent electrolytic or currentless deposition processes. A conductive electrical connection is thereby produced along the conduction paths, which fulfills the function of conductor tracks.

It is therefore possible to generate corresponding conductor tracks or conductor track structures three-dimensionally for the wiring along the component surface. The following advantages are associated with this method and this device:
1. Patterned structuring of the conduction paths is possible.
2. Elaborate through-contact techniques are obviated.
3. With an appropriate design, and it is also possible to use a batch process with an exposure mask. Lastly, metallized access openings can be formed through the encapsulation material or the plastic package compound, and terminal paths can thereby also be produced in the finished package.

Finally, the inner walls of the access openings may also be directly metallized currentlessly or electrolytically without an elaborate sputtering process. In principle, the following elements may be used as metals for the complexing: copper, nickel, palladium, cobalt, magnesium, platinum, iridium and/or silver. In general, all metals which are stable but form complexes or compounds that can be split under intense irradiation are suitable as deposits.

Figure 1:
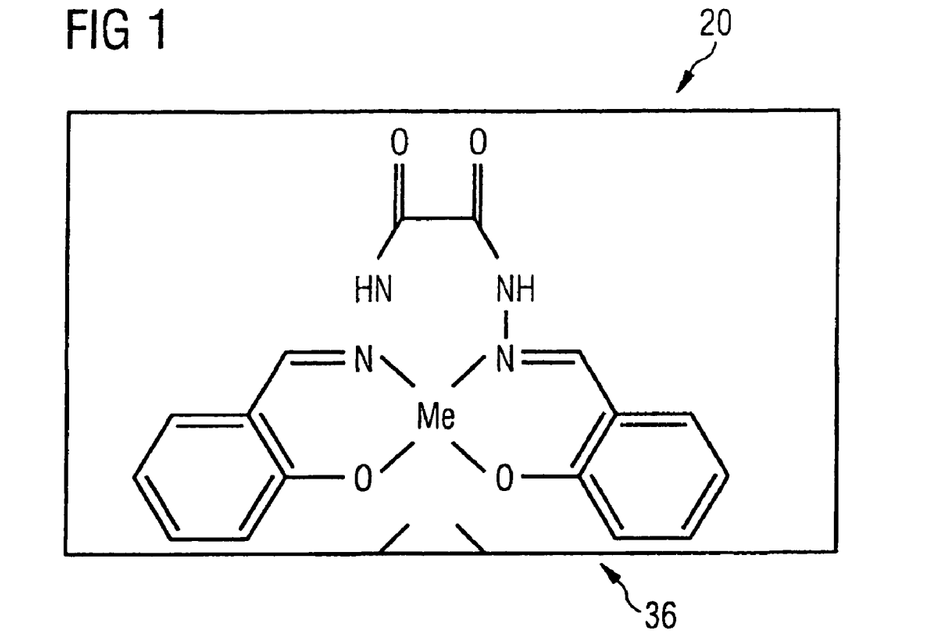
FIG. 1 illustrates a detail of a structural formula of a metalorganic compound.

FIG. 1 illustrates a detail of a structural formula of a metalorganic compound 20, the metal ion being denoted by Me. For the present invention, the metals Me copper, nickel, palladium, cobalt, magnesium, platinum, iridium and/or silver may be envisaged as metals Me. Those metals Me which are stable, but form metal complexes 36 or compounds that can be split under intense irradiation, may in general be used. The metal ions are then released as metals Me by irradiation. Instead of the metalorganic compounds 20 illustrated in FIG. 1, it is also possible to use metallic particles and/or carbon nanoparticles, such as fullerenes and/or carbon nanotubes, as electrically conducting deposits in a plastic package compound to form conduction paths with mutually isolated electrically conductive positions.

Figure 2:
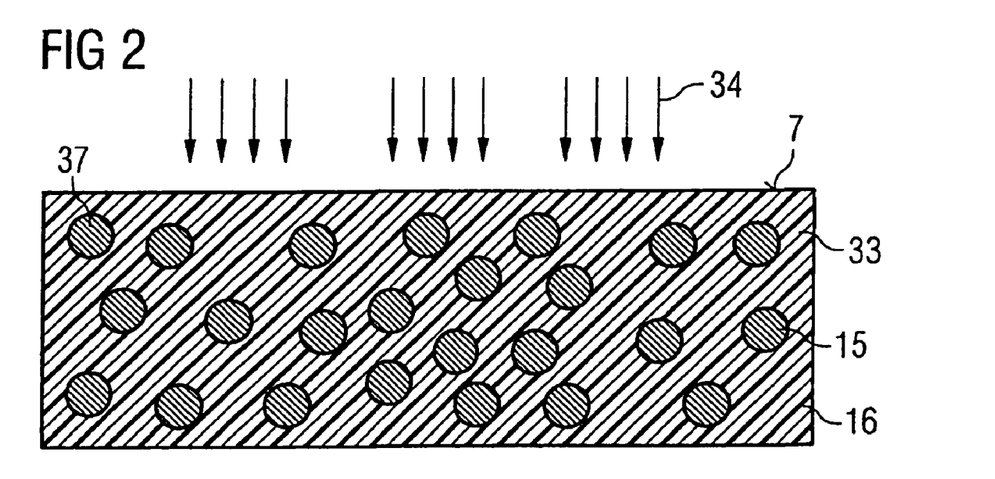
FIG. 2 illustrates an outline diagram of a plastic package compound with electrically conductive deposits under the effect of irradiation.

FIG. 2 illustrates an outline diagram of a plastic package compound 33 with electrically conductive deposits 15 under the effect of irradiation 34. The symbolically incorporated circular metallic deposits 15 do not represent the true structure of the incorporated electrically conducting particles, rather FIG. 2 merely illustrates that the electrically conducting deposits 15 are arranged mutually isolatedly distributed in the plastic package compound 33. This plastic package compound 33 forms the plastic 16 of the package. The irradiation 34 may on the one hand be photon radiation which, for example, can split metals from a metalorganic compound. On the other hand, the irradiation 34 may also cause the plastic package compound 33 to be ablated from the plastic outer face 7 until conductive positions 37 are exposed on the plastic outer face 7.

Figure 3:
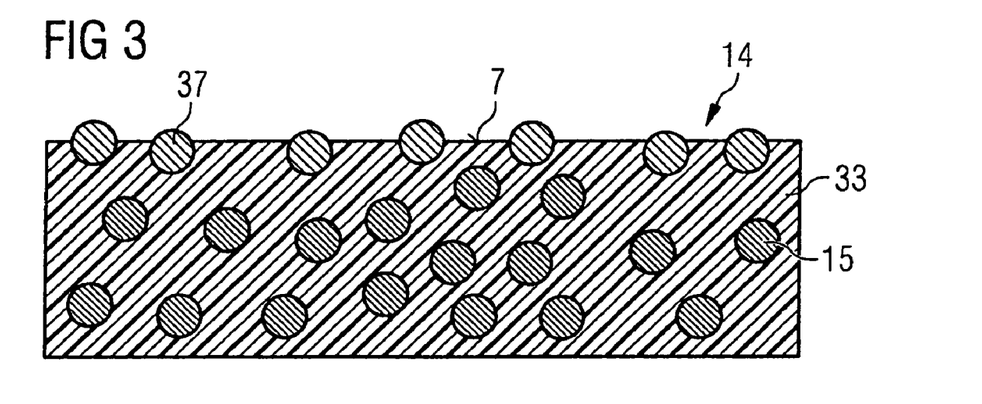
FIG. 3 illustrates an outline diagram of the plastic package compound=according to FIG. 2 after exposure of electrically conducting deposits as conductive positions on a plastic outer face.

FIG. 3 illustrates an outline diagram of a plastic package compound 33 according to FIG. 2 after exposure of electrically conducting deposits 15 as conductive positions 37 on a plastic outer face 7. This exposure of conductive positions 37 provides a conduction path 14 on the plastic outer face 7, which can subsequently be converted into a conductor track along the exposed electrically conducting positions 37 by amplification and enlargement of the conducting positions 37.

Figure 4:
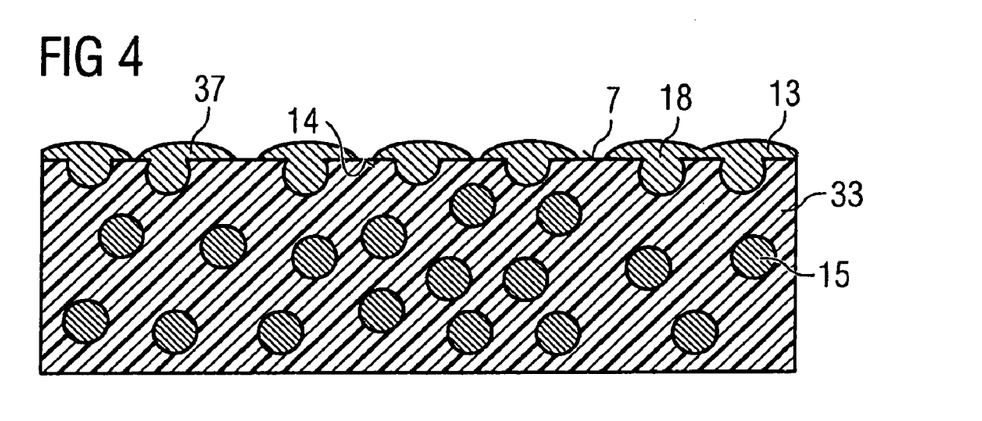
FIG. 4 illustrates an outline diagram of the plastic package compound according to FIG. 3 after amplification of the electrically conductive positions.

FIG. 4 illustrates an outline diagram of the plastic package compound 33 according to FIG. 3 after amplification of electrically conductive positions 37. This amplification of the electrically conductive positions 37 to form a thin virtually continuous metal layer 13, or a lower metal layer 18, may be carried out by currentless chemical deposition of metals on the plastic outer faces 7, if they comprise exposed electrically conductive positions 37. After the electrically conductive positions 37 have been amplified so that they form a continuous thin conductive metal layer 13, this metal layer 13 may be further amplified to form conductor tracks. The regions of the plastic outer faces 7 are covered with a protective layer if they are not to be amplified to form conductor tracks. A protective layer structured in such a way can be applied by photolithography on the plastic outer faces 7 of the plastic package of the semiconductor component.

Figure 5:
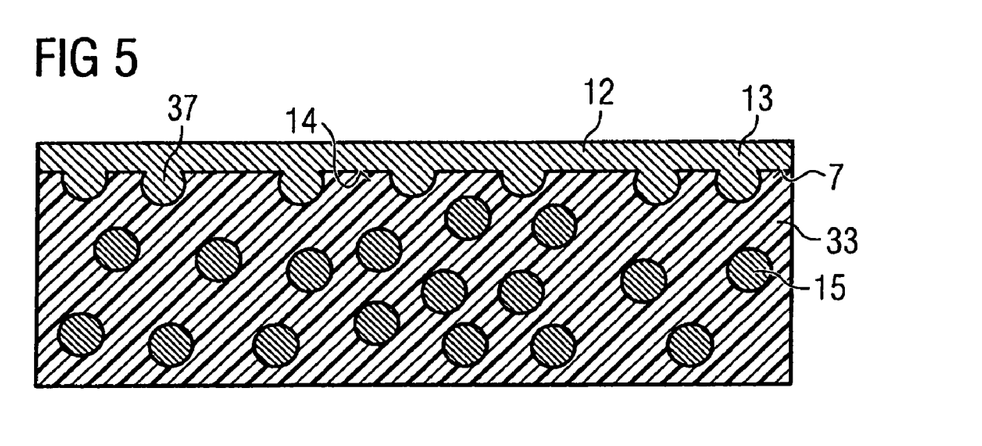
FIG. 5 illustrates an outline diagram of the plastic package compound according to FIG. 4 after deposition of a metal layer on the conduction paths.

FIG. 5 illustrates an outline diagram of the plastic package compound 33 according to FIG. 4 after deposition of a metal layer 13 on conduction paths 14. While FIG. 5 illustrates only a detail of the plastic package compound 33, on which such conduction paths 14 and outer conductor tracks 12 are formed, the subsequent figures illustrate the production of corresponding semiconductor components.

Figure 6:
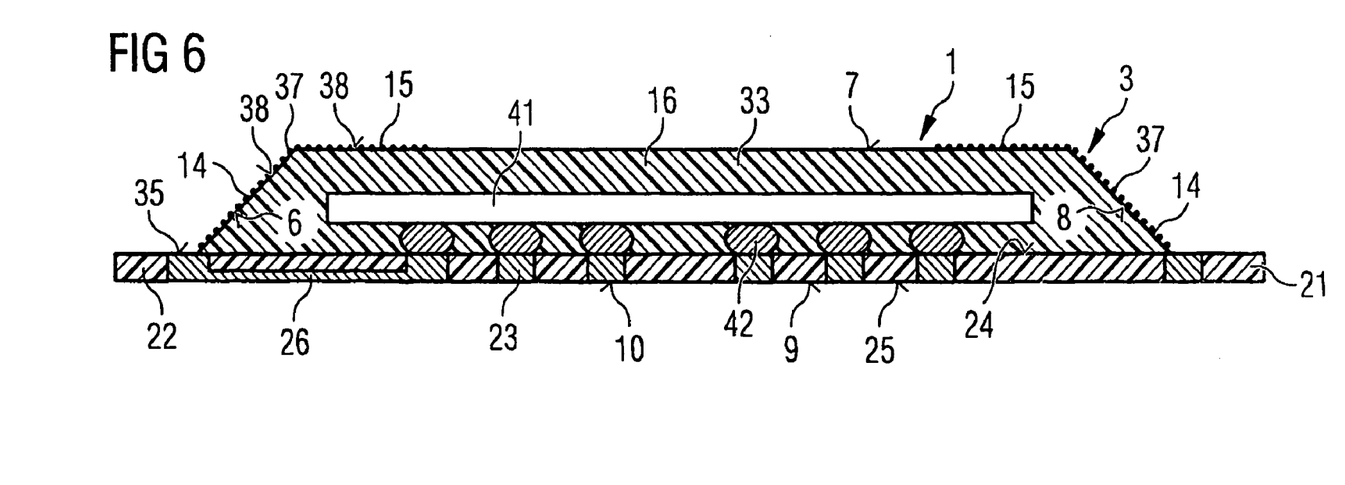
FIG. 6 illustrates a schematic cross section through a semiconductor component according to a first embodiment of the invention, having a plastic package which comprises conduction paths along its package outer contour.

FIG. 6 illustrates a schematic cross section through a semiconductor component 3 according to a first embodiment of the invention. This semiconductor component 3 includes a plastic package 1 which, with its plastic package compound 33, embeds a semiconductor chip 41 with flip-chip contacts 42 on a wiring substrate 21. The flip-chip contacts 42 of the semiconductor chip 41 are connected via through-contacts 23 through the wiring substrate 21 to outer contact faces 10 of the semiconductor component 3. In its edge regions 22 which extend beyond the plastic package compound 33, the wiring substrate 21 furthermore includes through-contacts 23 which include contact terminal faces 35 on the upper side 24 of the wiring substrate 21 and are in electrical connection with the lower outer contact faces 10 on the lower side via the wiring structure 26.

On the upper side 7 and the edge sides 6 and 8 of the plastic package 1, electrically conductive metal positions 37 in the form of conduction paths 14 are exposed along the package contour 38. To this end, as mentioned above, the plastic package compound 33 includes electrically conducting nanoparticles and/or nanometallic compounds which form the electrically conductive positions 37 of the conduction paths 14 under the effect of laser ablation or UV radiation, these conduction paths 14 not yet constituting continuous electrically coherent conductor tracks but being first compacted and amplified to form conductor tracks by appropriate deposition processes. The exposure of electrically conductive positions 37 is possible only with plastic package compounds in which electrically conducting particles have previously been incorporated, for example in the form of metalorganic compounds and/or nanoparticles. Some of these particles can be exposed by laser ablation or heat radiation. A plurality of electrically conducting metal layers may then be deposited on these exposed particles, or the conduction paths 14.

Figure 7:
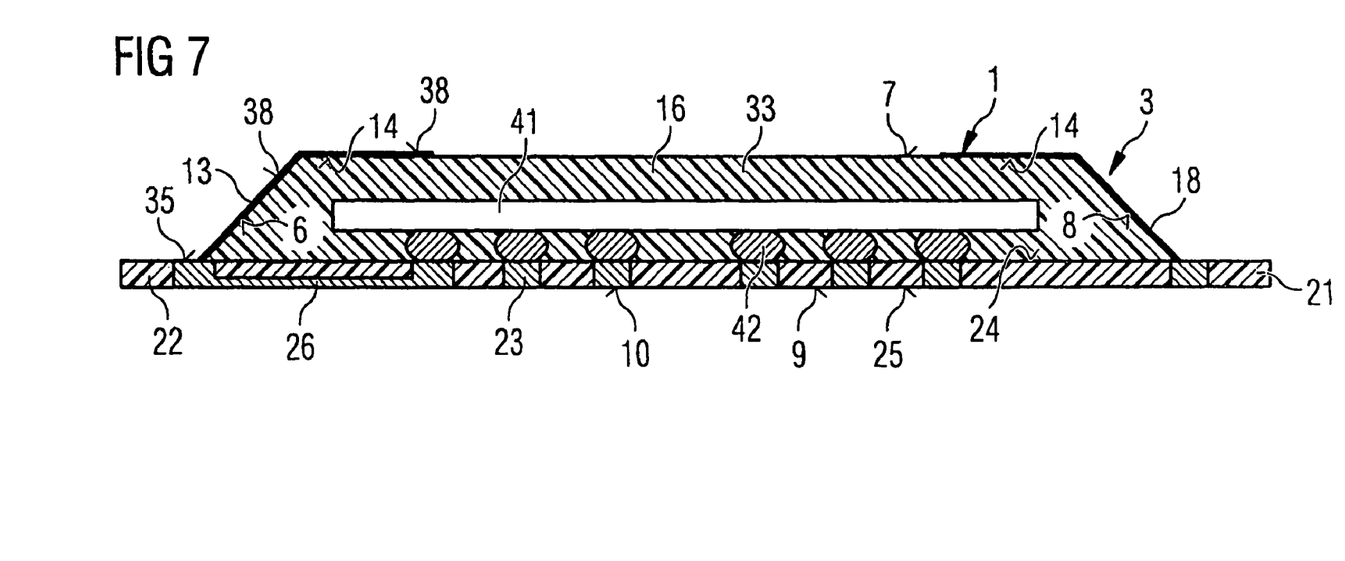
FIG. 7 illustrates a schematic cross section through the semiconductor component according to FIG. 5 after amplification of electrically conducting positions of the conduction paths.

FIG. 7 illustrates a schematic cross section through the semiconductor component 3 according to FIG. 6 after amplification of electrically conducting positions of the conduction paths 14 to form a metal layer 13. Besides chemical currentless deposition processes, this thin metal layer 13 may also be applied surface-wide on the plastic outer faces by sputtering or vapor deposition, so that electrical contacting in an electrolytic deposition bath is possible for further amplification of the conduction paths 14 to form conductor tracks. Before such electrolytic amplification of the conduction paths 14 to form conductor tracks, however, a protective layer is applied on the regions which are not intended to be amplified to form conductor tracks. Such protective layers can be structured with the aid of photolithography, in order to ensure selective application of conductor tracks in the electrolytic bath.

Figure 8:
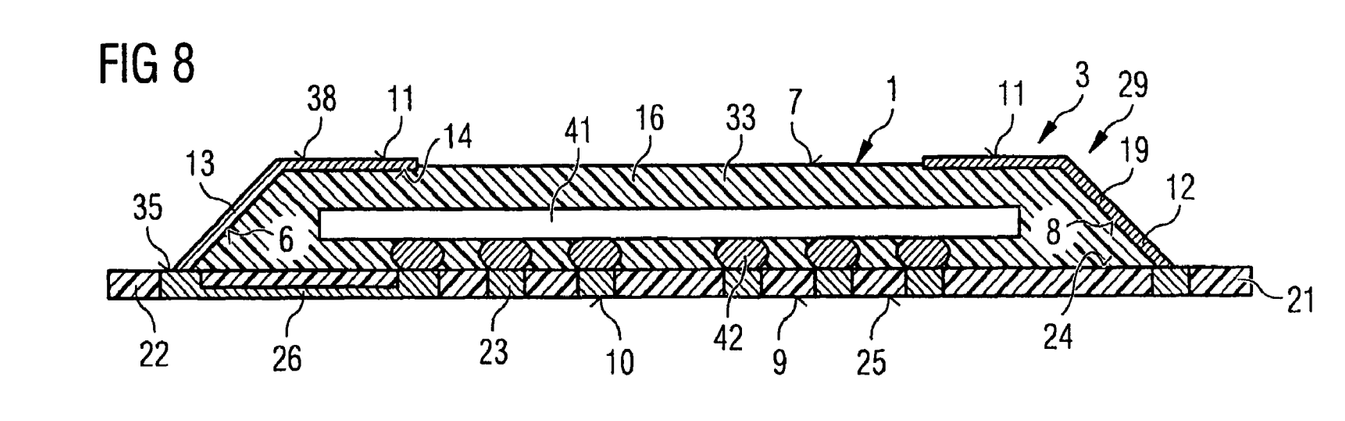
FIG. 8 illustrates a schematic cross section through the semiconductor component according to FIG. 7 after application of an upper metal layer on the conduction paths in order to form outer conductor tracks.

FIG. 8 illustrates a schematic cross section through the semiconductor component 3 according to FIG. 3 after application of an upper metal layer 19 on the conduction paths in order to form outer conductor tracks 12. These outer conductor tracks 12 comprise upper outer contact faces 11 on the upper side 7 of the plastic package 1, and connect these upper outer contact faces 11 to contact terminal faces 35 on edge-side regions 22 of a wiring substrate 21, which are connected by through-contacts 23 and the wiring structure 26 to lower outer contact faces 10 of the semiconductor component 1. The upper outer contact faces 11 and the lower outer contact faces 10 are thus electrically connected to one another via the outer conductor tracks 12. When structuring the conductor tracks 12, in particular on the upper side 7 of the plastic package 1, it is possible to produce any desired pattern in respect of the size and arrangement of outer contact faces 11. The semiconductor component 3 according to FIG. 8 is therefore suitable for receiving a stacked semiconductor component, the arrangement and size of the outer contact faces 11 being adaptable to the arrangement and size of the outer contacts of the semiconductor component to be stacked.

Figure 9:
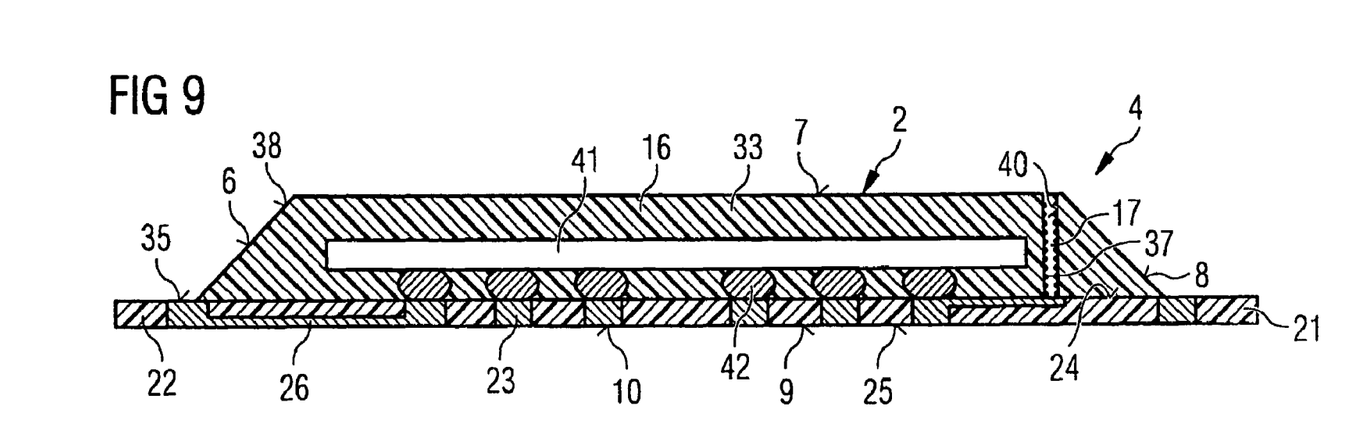
FIG. 9 illustrates a schematic cross section of a semiconductor component according to a second embodiment of the invention, having a plastic package according to the second embodiment of the invention.

FIG. 9 illustrates a schematic cross section of a semiconductor component 4 according to a second embodiment of the invention, having a plastic package 2 according to the second embodiment of the invention. Components with the same functions as in the previous figures are denoted by the same references and not explained again. This plastic package of the second embodiment of the invention differs from the plastic package 1 according to FIG. 6 of the first embodiment of the invention in that an access opening 17 from the upper side 7 of the plastic package 2 to the upper side 24 of the wiring substrate 21 has been made in the plastic package compound 33. Such an access opening 17 can likewise be made through the plastic package 2 by laser ablation. These access openings 17 have inner walls 40 which already comprise exposed metallically conductive positions 37.

Figure 10:
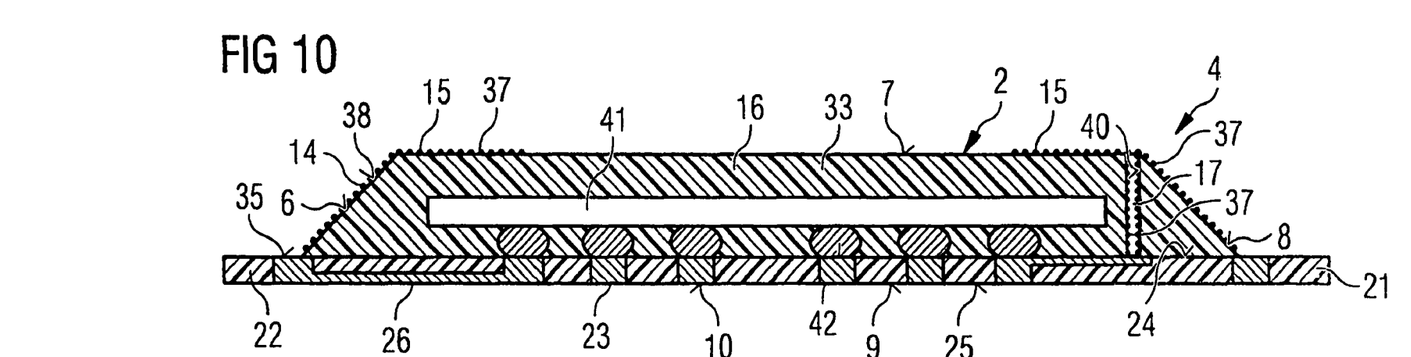
FIG. 10 illustrates a schematic cross section of the semiconductor component according to FIG. 9 after exposure of conductive positions for conduction paths on the plastic outer faces of the plastic package and inner faces of access openings through the package.

FIG. 10 illustrates a schematic cross section of the semiconductor component 4 according to FIG. 9 after exposure of conductive positions 37 for conduction paths 14 on the plastic outer faces of the plastic package and inner faces 6, 7, 8 of the plastic package 2. This exposure of conductive positions 37 on the plastic outer faces 6, 7 and 8 is carried out in the same way as for the plastic package 2 of the first embodiment of the invention according to FIG. 6. A corresponding thin electrically conducting metal layer is subsequently deposited on the inner faces 40 of the access openings 17 and on the conduction paths 14 on the plastic outer sides 7, 8 and 9. This thin metal layer is further amplified by electrolytic deposition.

Figure 11:
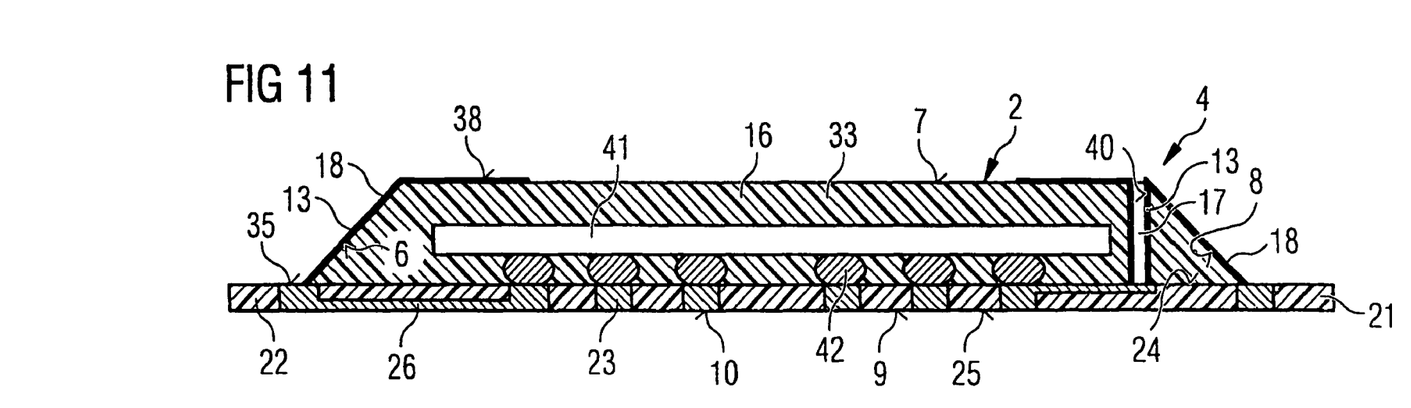
FIG. 11 illustrates a schematic cross section of the semiconductor component according to FIG. 10 after amplification of the electrically conductive positions.

FIG. 11 illustrates a schematic cross section of the semiconductor component according to FIG. 10 after amplification of the electrically conductive positions to form a thin first lower metal layer 18.

Figure 12:
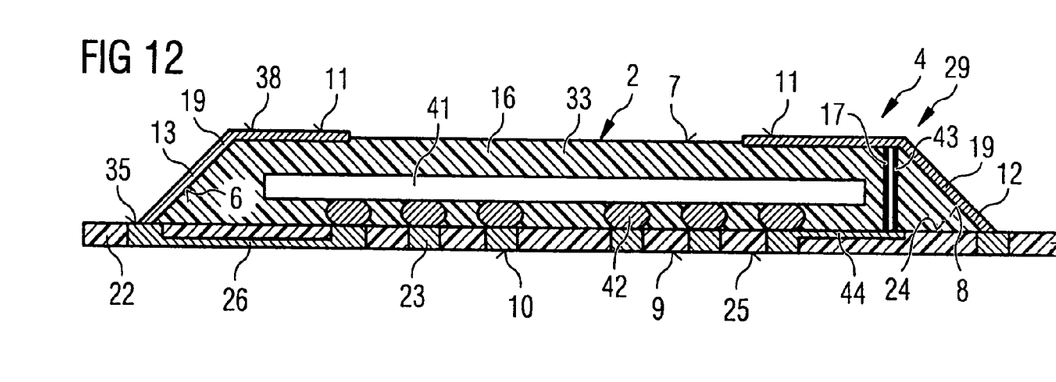
FIG. 12 illustrates a schematic cross section of a semiconductor component according to FIG. 11 after application of an upper metal layer in order to form outer conductor tracks.

FIG. 12 illustrates a schematic cross section of a semiconductor component 4 according to FIG. 11 after application of an upper metal layer 19 in order to form outer conductor tracks 12 and in order to form a through-contact 43 through the plastic package 2. In this embodiment of the invention, the through-contact 43 connects an upper outer contact face 11 on the upper side 7 of the plastic package 2 to a lower outer contact face 10 on the lower side 9 of the semiconductor component 4, which is also the lower side 25 of the wiring substrate 21. To this end, the wiring substrate 21 comprises a wiring structure 44 on the upper side 24 of the wiring substrate 21. Three-dimensional networks can be produced inside the plastic package compound 33 with the aid of such access contacts 43.

Figure 13:
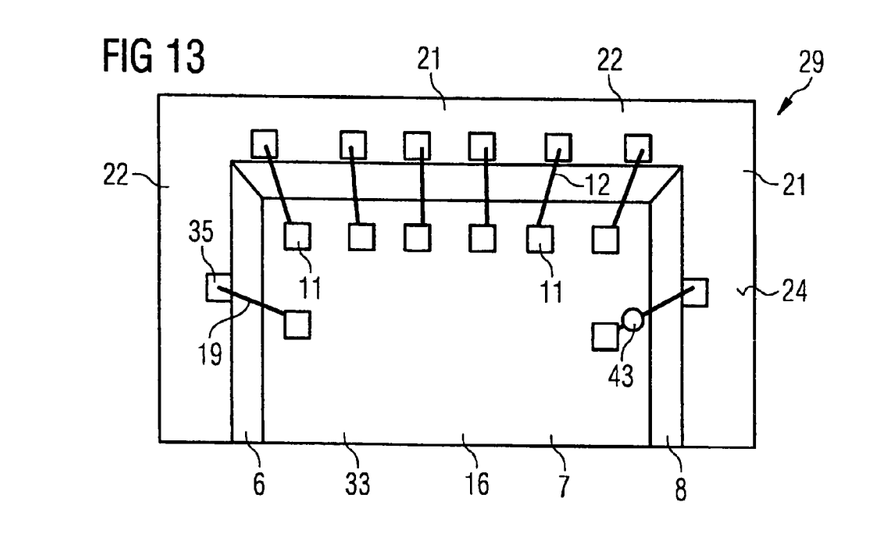
FIG. 13 illustrates a schematic plan view of the semiconductor component according to FIG. 12, having outer conductor tracks and a through-contact.

FIG. 13 illustrates a schematic plan view of the semiconductor component 4 according to FIG. 12, having outer conductor tracks 12 and a through-contact 43. The outer conductor tracks 12 thus connect lower outer contact faces 10 to contact terminal faces 35 in an edge region 22 of the wiring substrate 21. The upper outer contact faces 11 may in this case be arranged arbitrarily on the upper side 7, and adapted to a corresponding semiconductor component to be stacked with its outer contact arrangements.

Figure 14:
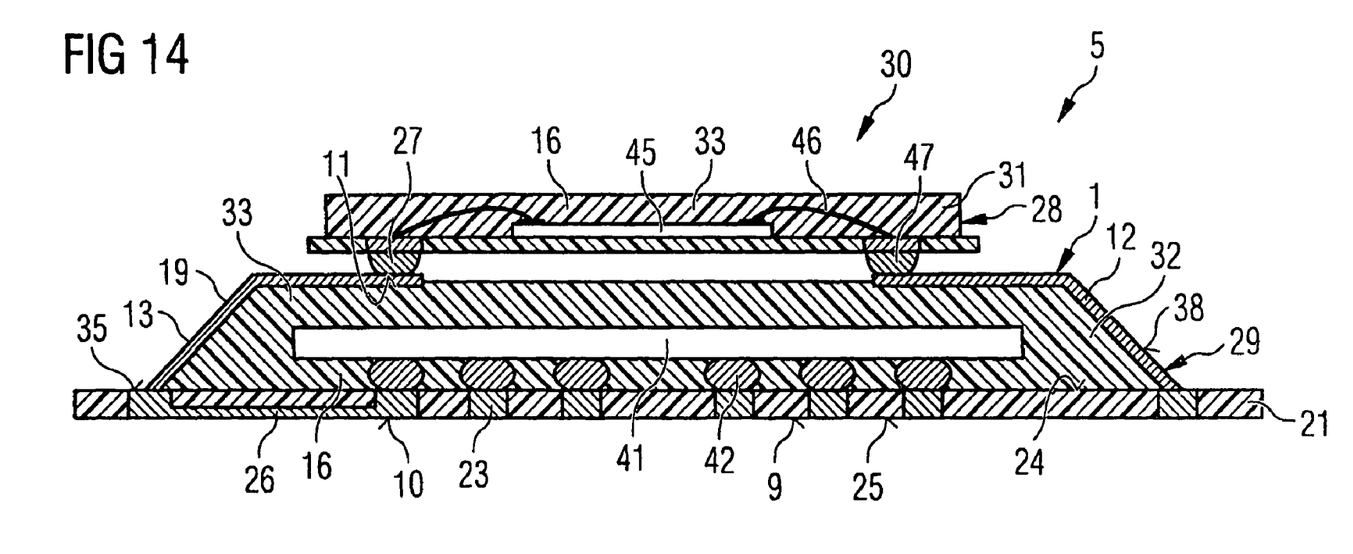
FIG. 14 illustrates a schematic cross section through a semiconductor module in the form of a semiconductor component stack, which comprises a memory component according to FIG. 8 as the semiconductor base component and a logic component as the stacked semiconductor component.

FIG. 14 illustrates a schematic cross section through a semiconductor module 30 in the form of a semiconductor component stack 5, which comprises a memory component 32 according to FIG. 8 as the semiconductor base component 29 and a logic component 31 as the stacked semiconductor component 28. While the semiconductor base component 39 comprises a semiconductor chip 41 with flip-chip contacts 42 as mentioned above, the stacked semiconductor component 28 comprises a semiconductor chip 45 which is connected via bonding wires 46 to its outer contacts 27 in the form of solder beads 47 in edge regions of the lower side of the stacked semiconductor component 28. Arbitrarily variable semiconductor modules 30 can thus advantageously be assembled from semiconductor components 4.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A plastic package comprising:
   a semiconductor chip embedded in a plastic package compound defining plastic outer faces, the plastic outer faces including a lower side having lower outer contact faces; and an upper side having upper outer contact faces,
   wherein the lower and upper outer contact faces are electrically connected together via conductor tracks that are positioned at least in part on the plastic outer faces, and wherein the conductor tracks comprise a metal layer which is arranged on conduction paths, the conduction paths comprising exposed conducting deposits in the plastic package compound, and
   wherein the plastic package compound is comprised of a plurality of mutually electrically isolated electrically conductive deposits including metal complexes distributed throughout the plastic package compound that provide the exposed conducting deposits in the plastic package compound.

2. The plastic package according to claim 1, wherein the conductor tracks are arranged in access openings through the plastic package.

3. The plastic package according to claim 1, wherein the exposed conducting deposits on the conduction paths are covered with a lower metal layer a few nanometers thick.

4. The plastic package according to claim 1, wherein the exposed conducting deposits on the conduction paths are covered with an upper metal layer a few micrometers thick.

5. A semiconductor component comprising:
a plastic package with plastic outer faces;
a semiconductor chip embedded within the plastic package;
a lower side having lower outer contact faces; and
an upper side having upper outer contact faces, wherein the lower and upper outer contact faces are electrically connected together via conductor tracks that are positioned at least in part on the plastic outer faces, wherein the conductor tracks comprise a metal layer which is arranged on conduction paths, the conduction paths comprising exposed conducting deposits in the plastic of the package, and wherein the plastic package compound is comprised of a plurality of mutually electrically isolated electrically conductive deposits distributed throughout the plastic package compound that provide the exposed conducting deposits in the plastic of the package including deposits of a metalorganic compound, whose metallic constituents are exposed in the conduction paths and covered by the metal layer.

6. The semiconductor component according to claim 5, wherein the plastic package comprises on its lower side a wiring substrate defining an edge region having through-contacts which are electrically connected to the conductor tracks on an upper side of the wiring substrate and are in electrical connection with a wiring structure on a lower side of the wiring substrate, the wiring structure connecting the through-contacts to the lower outer contact faces.

7. The semiconductor component according to claim 5, wherein the size and arrangement of the upper outer contact faces on the upper side of the semiconductor component corresponds to the size and arrangement of surface-mountable outer contacts of a semiconductor component to be stacked.

8. A semiconductor module comprising:
a semiconductor base component; and
at least one semiconductor component stacked thereon, the semiconductor base component comprising
  a plastic package having plastic outer faces, which comprises a lower side having lower outer contact faces, and an upper side having upper outer contact faces,
  a semiconductor chip embedded in the plastic package;
  wherein the lower and upper outer contact faces are electrically connected together via conductor tracks that are positioned at least in part on the plastic outer faces, and wherein the conductor tracks comprise a metal layer which is arranged on conduction paths, the conduction paths comprising exposed conducting deposits in the plastic of the package, and
  wherein the plastic package compound is comprised of a plurality of mutually electrically isolated electrically conductive deposits including metal complexes distributed throughout the plastic package compound that provide the exposed conducting deposits in the plastic of the package.

9. The semiconductor module according to claim 8, wherein the stacked semiconductor component comprises surface-mountable outer contacts.

10. The semiconductor module according to claim 8, wherein the semiconductor module comprises memory components.

11. The semiconductor module according to claim 10, wherein the memory component is a DRAM.

12. The semiconductor module according to claim 8, wherein the semiconductor module comprises at least one logic component, including a microprocessor chip package and a memory component. contacts and the access opening is then electrolytically filled with the electrically conducting material of the upper metal layer.

13. A plastic package comprising,
  a semiconductor chip embedded in a plastic package compound defining plastic outer faces, the plastic outer faces including a lower side having lower outer contact faces; and an upper side having upper outer contact faces,
  wherein the lower and upper outer contact faces are electrically connected together via conductor tracks that are positioned at least in part on the plastic outer faces, and wherein the conductor tracks comprise a metal layer which is arranged on conduction paths, the conduction paths comprising exposed conducting deposits in the plastic package compound,
  wherein the exposed conducting deposits in the plastic comprise conducting nanoparticles, and
  wherein the nanoparticles are fullerenes.

14. A plastic package comprising:
  a semiconductor chip embedded in a plastic package compound defining plastic outer faces, the plastic outer faces including a lower side having lower outer contact faces; and an upper side having upper outer contact faces,
  wherein the lower and upper outer contact faces are electrically connected together via conductor tracks that are positioned at least in part on the plastic outer faces, and wherein the conductor tracks comprise a metal layer which is arranged on conduction paths, the conduction paths comprising exposed conducting deposits in the plastic package compound,
  wherein the plastic package compound is comprised of a plurality of mutually electrically isolated electrically conductive deposits distributed throughout the plastic package compound, and
  wherein the exposed conducting deposits in the plastic package compound comprise carbon nanotubes.

* * * * *

UNITED STATES PATENT AND TRADEMARK OFFICE
CERTIFICATE OF CORRECTION

PATENT NO. : 7,554,196 B2  Page 1 of 1
APPLICATION NO. : 11/247068
DATED : June 30, 2009
INVENTOR(S) : Bachmaier et al.

It is certified that error appears in the above-identified patent and that said Letters Patent is hereby corrected as shown below:

Column 12, line 16, delete "contacts and the access opening is then electronically filled with the electrically conducting material of the upper metal layer".

Signed and Sealed this

Eighth Day of December, 2009

David J. Kappos
*Director of the United States Patent and Trademark Office*